United States Patent
Kuhn

(10) Patent No.: US 6,975,695 B1
(45) Date of Patent: Dec. 13, 2005

(54) CIRCUIT FOR CORRECTION OF DIFFERENTIAL SIGNAL PATH DELAYS IN A PLL

(75) Inventor: Jay A. Kuhn, Seattle, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 630 days.

(21) Appl. No.: 09/846,146

(22) Filed: Apr. 30, 2001

(51) Int. Cl.[7] ............................. H04L 25/00; H03D 3/24
(52) U.S. Cl. ....................... 375/371; 375/373; 375/375; 375/376
(58) Field of Search .................................. 375/371, 354, 375/373, 374, 375, 376, 355, 372

(56) References Cited

U.S. PATENT DOCUMENTS

| | | | | |
|---|---|---|---|---|
| 4,617,679 A | * | 10/1986 | Brooks ......................... 375/374 |
| 4,623,805 A | * | 11/1986 | Flora et al. ................... 327/152 |
| 4,755,704 A | * | 7/1988 | Flora et al. ................... 327/152 |
| 5,049,766 A | * | 9/1991 | van Driest et al. .......... 327/269 |
| 5,081,655 A | * | 1/1992 | Long ............................. 375/373 |
| 5,220,201 A | * | 6/1993 | Kawasaki et al. ........... 327/156 |
| 5,446,867 A | * | 8/1995 | Young et al. ................. 713/503 |
| 5,463,337 A | * | 10/1995 | Leonowich .................. 327/158 |
| 5,771,264 A | * | 6/1998 | Lane ............................ 375/376 |
| 5,790,611 A | * | 8/1998 | Huang et al. ................ 375/371 |
| 5,838,179 A | * | 11/1998 | Schmidt ....................... 327/156 |
| 5,889,436 A | * | 3/1999 | Yeung et al. ................... 331/2 |
| 5,974,105 A | * | 10/1999 | Wang et al. .................. 375/376 |
| 6,100,736 A | * | 8/2000 | Wu et al. ..................... 327/159 |
| 6,125,157 A | * | 9/2000 | Donnelly et al. ............ 375/371 |
| 6,140,854 A | * | 10/2000 | Coddington et al. ........ 327/158 |
| 6,150,855 A | * | 11/2000 | Marbot ......................... 327/116 |
| 6,178,123 B1 | * | 1/2001 | Kato et al. ................... 365/194 |
| 6,201,424 B1 | * | 3/2001 | Harrison ...................... 327/159 |
| 6,201,448 B1 | * | 3/2001 | Tam et al. ..................... 331/25 |
| 6,208,183 B1 | * | 3/2001 | Li et al. ....................... 327/161 |
| 6,671,341 B1 | * | 12/2003 | Kinget et al. ................ 375/373 |
| 6,687,320 B1 | * | 2/2004 | Chiu et al. ................... 375/376 |
| 6,775,342 B1 | * | 8/2004 | Young et al. ................ 375/371 |

* cited by examiner

Primary Examiner—Chieh M. Fan
Assistant Examiner—Jason M. Perilla
(74) Attorney, Agent, or Firm—Christopher P. Maiorana, PC

(57) ABSTRACT

An apparatus comprising a first circuit and a second circuit. The first circuit may be configured to (i) select one of a plurality of input signals and (ii) generate (a) an output signal having a frequency and (b) one or more control signals in response to a skew signal. The second circuit may be configured to generate the skew signal in response to the one or more control signals. The first circuit may be configured to minimize skew between the selected input signal and a feedback of the output signal, in response to the skew signal.

17 Claims, 4 Drawing Sheets

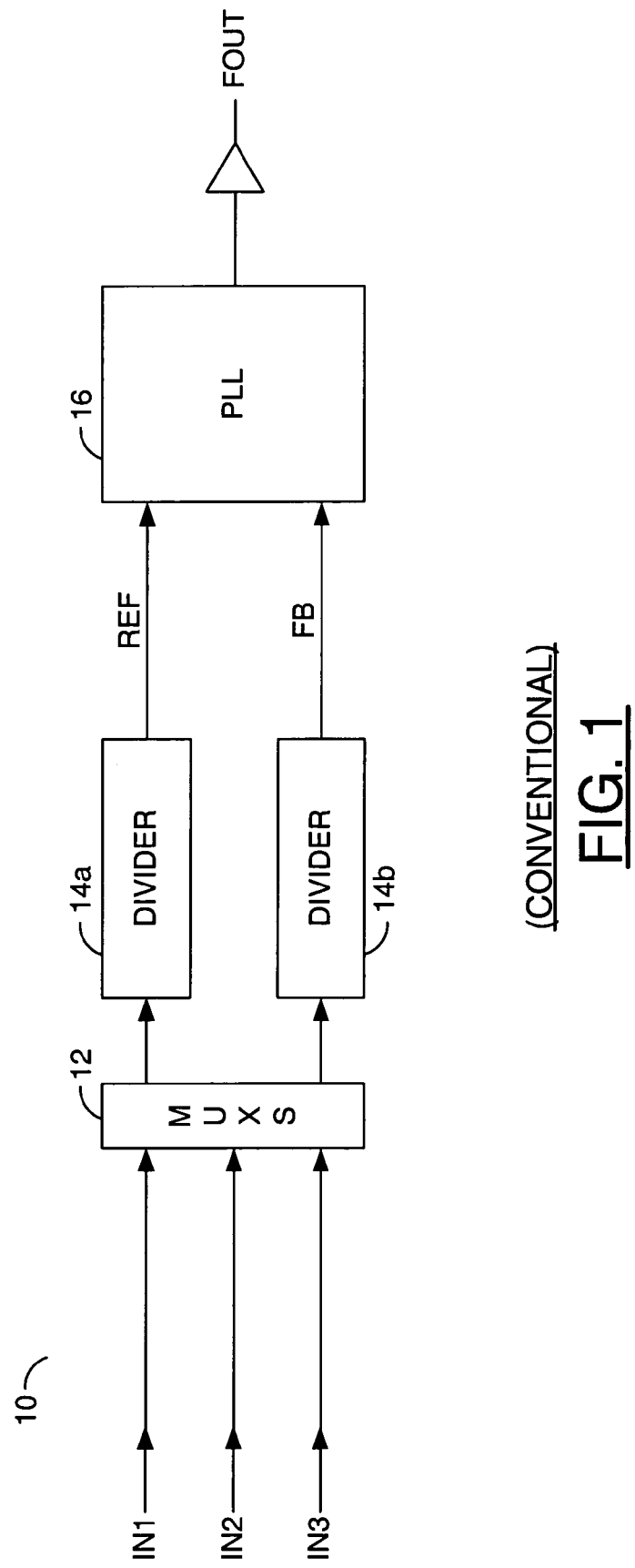
FIG. 1 (CONVENTIONAL)

CIRCUIT FOR CORRECTION OF DIFFERENTIAL SIGNAL PATH DELAYS IN A PLL

FIELD OF THE INVENTION

The present invention relates to a method and/or architecture for correction of differential signal path delays generally and, more particularly, to a method and/or architecture for correction of skew between an input and an output of a phase locked loop (PLL).

BACKGROUND OF THE INVENTION

Referring to FIG. 1, a block diagram of a circuit 10 illustrating a conventional phase locked loop circuit is shown. The circuit 10 includes a multiplexer 12, a number of dividers 14a and 14b and a phase lock loop (PLL) 16. Two or more inputs (i.e., paths IN1, IN2 and IN3) are presented to the multiplexer 12. One input is selected and presented as a reference signal REF, through the divider 14a, to the PLL 16. Another input is selected and presented as a feedback signal FB, through the divider 14b, to the PLL 16. Any one of the inputs (IN1, IN2, or IN3) could be implemented as the feedback signal FB or the reference signal REF. A second feedback signal or reference signal can be implemented from the input IN1, IN2, or IN3. The multiplexer 12 selects the desired input(s) to be used for the reference and feedback input paths to the PLL 16. The dividers 14a and 14b are implemented as digital counters or dividers before the PLL 16 to provide for frequency scaling of the reference and feedback signals. In some cases, the divider(s) 14a and/or 14b and the multiplexer 12 are not used.

The circuit 10 provides a PLL output frequency FOUT that is frequency and phase locked to the input reference signal REF. The frequency FOUT is determined by the integer ratio of the feedback to reference dividers 14a and 14b. Ideally the phase of whichever input is selected as the reference signal REF is equal to the phase of the input selected as the feedback signal FB. Phase error is determined from the difference in arrival times (skew) of either the rising or falling edge of the reference input REF relative to the feedback input FB.

Phase can be expressed in radians by dividing the skew by the period and multiplying by $2\pi$ (for radians) or 360° (for degrees). The term "skew" typically implies the long term or "average" time difference between signals. The terms "phase noise" or "jitter" are used to describe the dynamic variations in the arrival time between signals.

Disadvantages with the circuit 10 include (i) time delay differences through the dividers 14a and 14b and (ii) PLL 16 input skew errors. Such disadvantages contribute to input skew of the reference and feedback paths (i.e., skew does not equal zero). For example, a PLL typically uses an analog charge pump as part of the phase detection circuit. Analog mismatches cause skew at an input of the PLL to be non-zero. Time delay differences between the reference and feedback paths show up as non-zero phase skew at the PLL input as well. Furthermore, delay mismatches in the reference and feedback paths through the multiplexer 12 also cause phase skew. Mismatch within the long chain of required digital and analog circuitry for the reference and feedback paths (from the inputs IN1, IN2, IN3 to the charge pump in the PLL 16) is likely to cause input skew. Conventional analog charge pumps have one or more limitations such as P/N current mismatches and differences in charge injection.

Another conventional approach for correction of signal path delays in PLLs is to implement bang—bang digital control loops. Such control loops can be accurate, but are very slow. Conventional bang—bang control loops have a speed/jitter trade-off and can still have skew problems due to charge pump imbalance. Neither of these conventional techniques address time delays in counters and digital circuitry that occur before the PLL.

SUMMARY OF THE INVENTION

The present invention concerns an apparatus comprising a first circuit and a second circuit. The first circuit may be configured to (i) select one of a plurality of input signals and (ii) generate (a) an output signal having a frequency and (b) one or more control signals in response to a skew signal. The second circuit may be configured to generate the skew signal in response to the one or more control signals. The first circuit may be configured to minimize skew between the selected input signal and a feedback of the output signal, in response to the skew signal.

The objects, features and advantages of the present invention include providing a method and/or architecture for correction of skew, or time differential, between an input and an output of a phase locked loop (PLL) that may (i) implement digitally based skew, (ii) implement a low frequency phase noise reduction circuit, (iii) be applied externally to an existing PLL, (iv) be implemented without changes to the PLL design, (v) be setup with multiple phase comparators to monitor different combinations of inputs, and/or (vi) allow a simple self test of the internal skew of the PLL path.

BRIEF DESCRIPTION OF THE DRAWINGS

These and other objects, features and advantages of the present invention will be apparent from the following detailed description and the appended claims and drawings in which:

FIG. 1 is a block diagram of a conventional circuit for differential signal path correction;

DETAILED DESCRIPTION OF THE PREFERRED EMBODIMENTS

Figure 2:
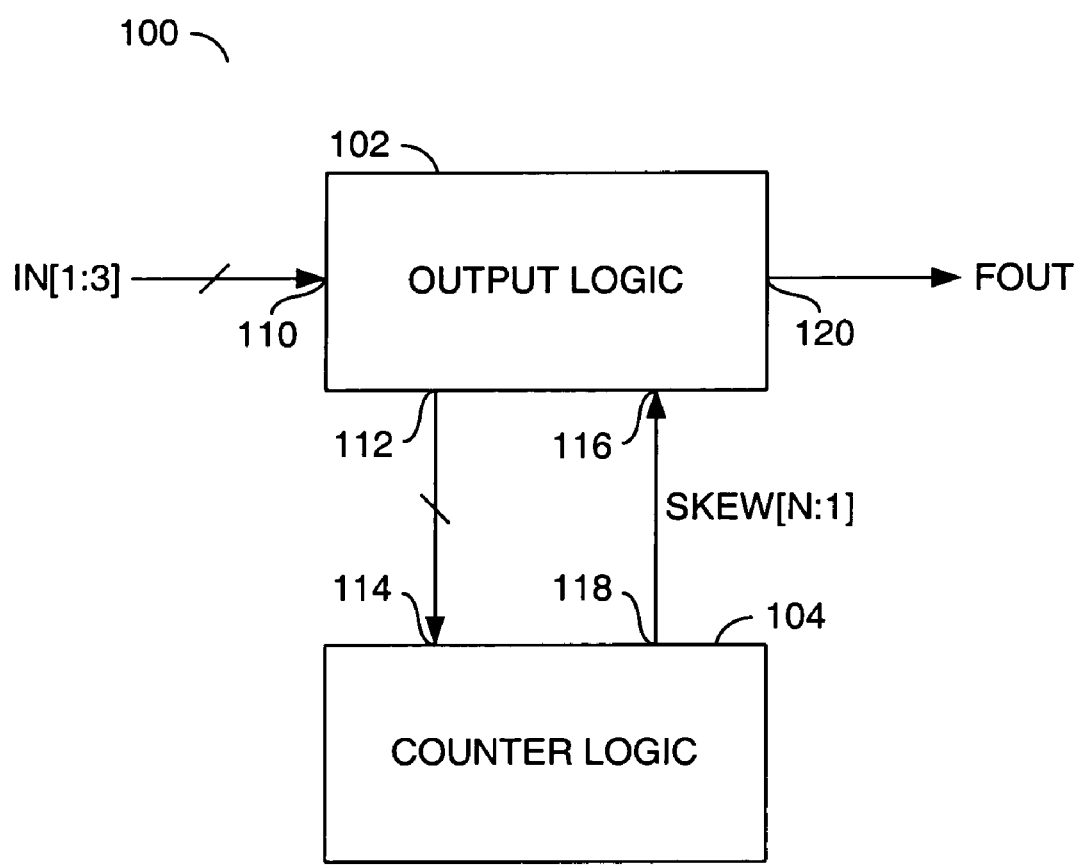
FIG. 2 is a block diagram of a preferred embodiment of the present invention.

Referring to FIG. 2, a block diagram of a circuit 100 is shown in accordance with a preferred embodiment of the present invention. The circuit 100 may provide a precision digital phase comparator (to be discussed in connection with FIG. 3) to minimize timing skew in two matched digital clock paths. The circuit 100 may de-skew an input path and PLL in a zero delay buffer.

The circuit 100 generally comprises a block (or circuit) 102 and a block (or circuit) 104. The circuit 102 may be implemented as an output logic circuit that may include a Phase Locked Loop (PLL) to be described in more detail in connection with FIG. 3. The circuit 104 may be implemented as a counter logic circuit. The circuit 102 may have an input 110 that may receive one or more input signals (e.g., IN[1:n], where n is an integer). The particular number of input signals may be varied to meet the design criteria of a particular implementation. The circuit 102 may also have an output 112 that may present one or more signals to an input 114 of the counter logic 104, an input 116 that may receive an indication signal (e.g., SKEW[N:1]) from an output 118 of the counter logic 104, and an output 120 that may present a signal (e.g., FOUT). The signal FOUT may be a periodic signal oscillating at a particular frequency or a non-periodic signal having a number of edges that are not equally spaced.

The circuit 100 may reduce the skew, or time differential, between a selected one of the input signals IN[1:n] and a feedback of the output signal FOUT. The feedback of the output signal FOUT is generally presented as one of the input signals IN[1:n]. The circuit 100 may also reduce low frequency phase noise of a phase locked loop. In one example, the circuit 100 may be implemented as a skew correction circuit. In another example, the circuit 100 may be implemented as a zero delay buffer. However, the circuit 100 may be implemented for other applications to match two path delays (e.g., the circuit 100 is not necessarily limited to PLL applications).

Figure 3:
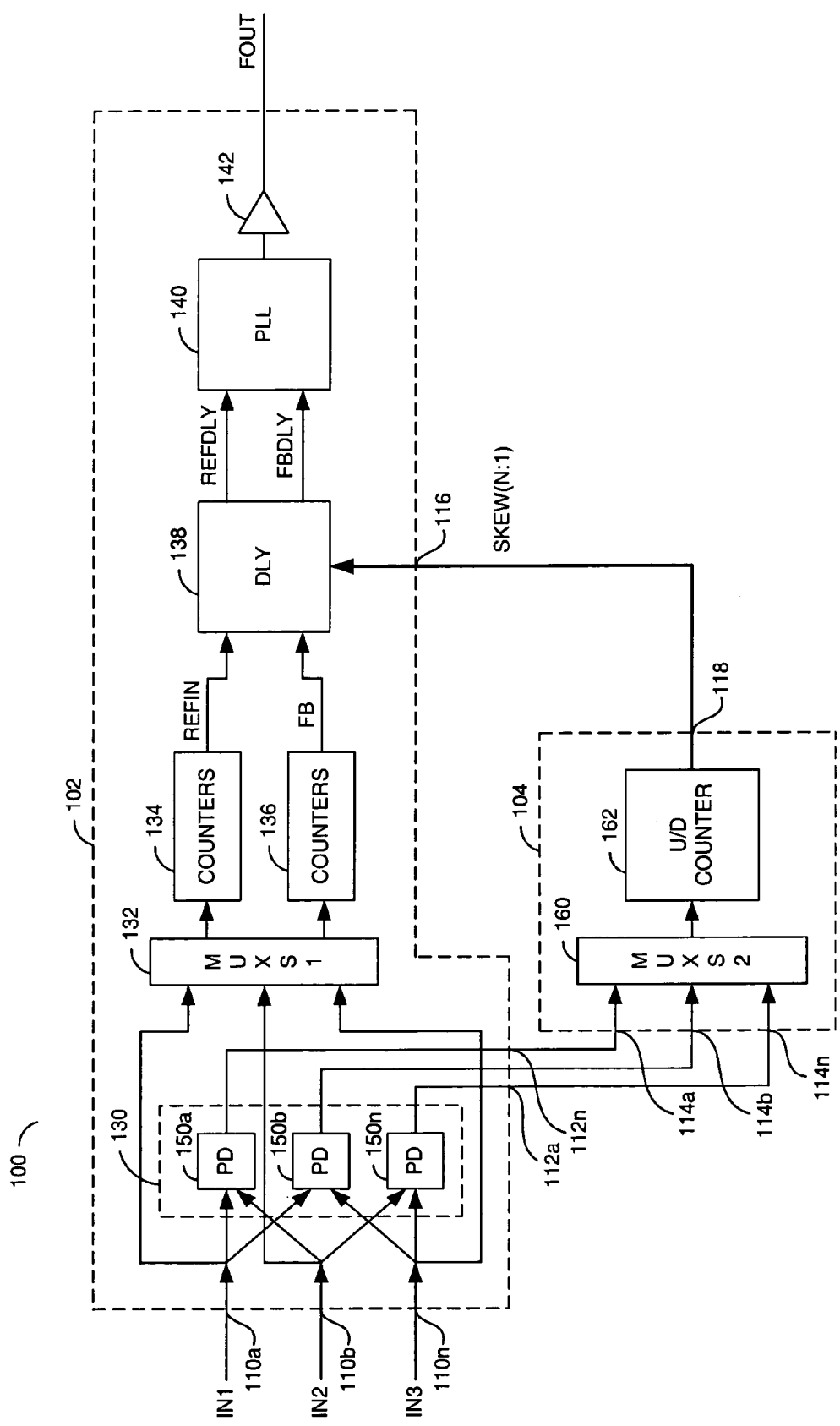
FIG. 3 is a detailed block diagram of the circuit of FIG. 2.

Referring to FIG. 3, a more detailed diagram of the circuit 100 is shown. The circuit 102 generally comprises a comparator block (or circuit) 130, a multiplexer block (or circuit) 132, a counter 134, a counter 136, a delay block (or circuit) 138, a phase lock loop circuit 140 and a buffer 142. The delay circuit 138 may be implemented as a digitally programmable delay line circuit. In another example, the delay circuit 138 may be implemented as a skew generation circuit. The comparator section 130 may be implemented as a number of comparators 150a–150n. The circuit 104 generally comprises a multiplexer 160 and a counter 162. One of the signals IN1, IN2, IN3 may be implemented as a reference signal presented to the counter 134. One of the signals IN1, IN2, IN3 may be implemented as a feedback signal presented to the counter 136.

Figure 4:
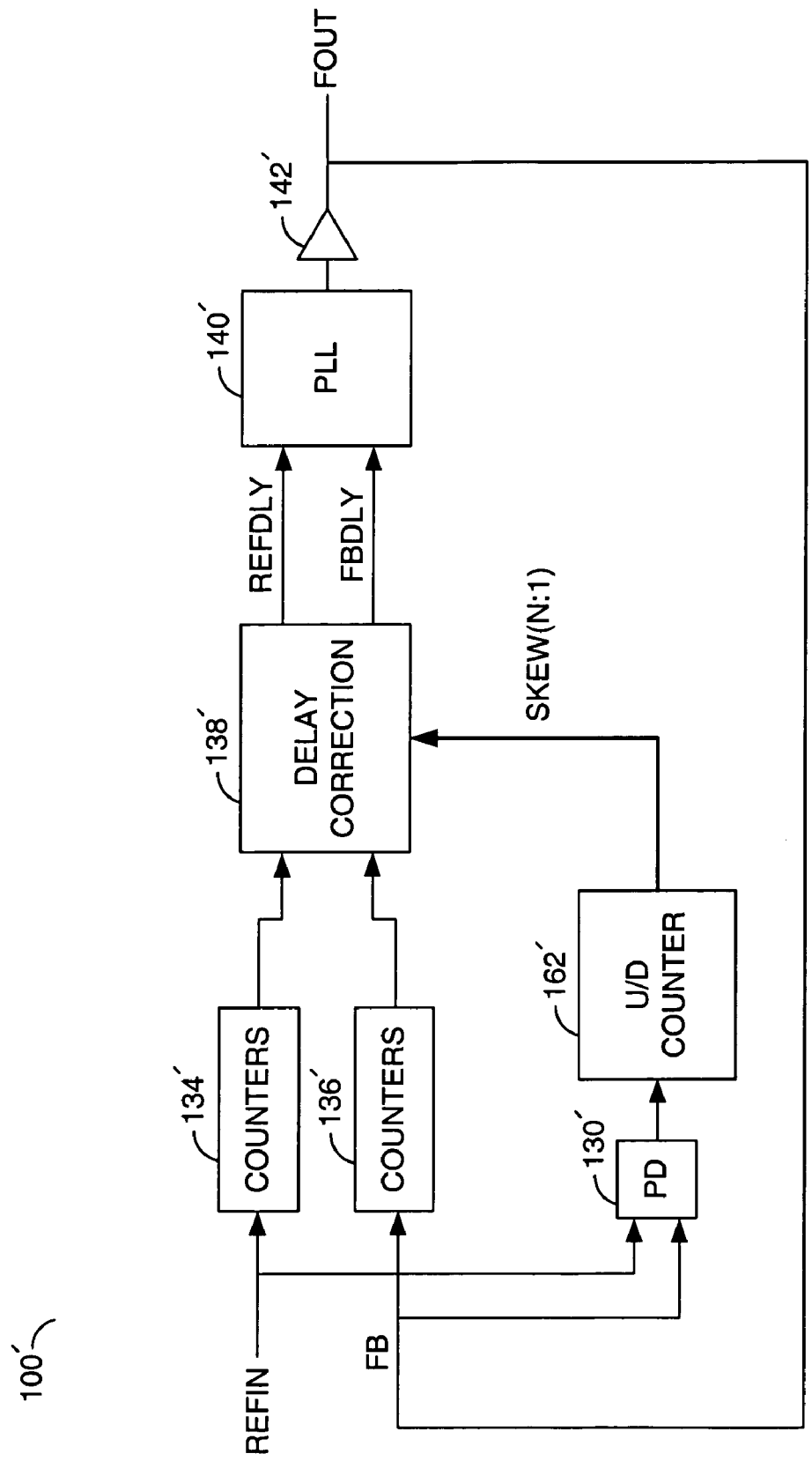
FIG. 4 is a detailed block diagram of an alternate embodiment of the present invention.

Referring to FIG. 4, an alternate embodiment of a circuit 100' is shown. The circuit 100' may be similar to the circuit 100. The circuit 100' may illustrate digital detection/correction within the PLL 140'. The precision digital phase comparator 130' may detect phase differences between the signal REFIN and the signal FB. The frequency of the signal FB may be a high frequency (e.g., 400 MHz or more). In such an example, the counter 136' may be implemented as a ¼ frequency counter and may integrate phase error. The delay correction circuit 138' may compensate for skew in response to the signal SKEW(N:1) received from the counter 162'. Additionally, the circuit 100' may have multiple input paths (e.g., greater than one reference clock signal and greater than one feedback clock signal). The delay correction circuit 138' may be a digitally programmable analog delay.

The precision phase comparator block 130' (or 150a–150n of FIG. 3) generally produces a digital "1" or a digital "0" output, depending on whether reference signal REFIN is leading or lagging in time compared with the feedback signal FB. The counters 134 and 136 may be implemented as a form of up/down counters that generally integrate the pulses out of the PD block 130. The delay circuit 138 may independently generate a delay difference or skew, between the reference and feedback paths, where the difference is proportional to the digital word SKEW[N:1].

Consider the example where the PLL 140 obtains lock and reduces the phase skew to some value based on the above mentioned imperfections. One of the phase detectors 150a–150n is generally chosen (while the other phase detectors 150a–150n are disabled) based on which two of the inputs IN1, IN2, or IN3 is selected. The multiplexer 160 may select the output of the selected phase detector 150a–150n and multiplex the output to the U/D counter 162. If the reference input signal REFIN arrives earlier in phase (time) than the feedback input, then the output of the selected phase detectors 150a–150n is a digital "1". The output of the phase detectors 150a–150n is a digital "0" if the feedback input arrivers earlier.

When a "1" is presented by a particular phase detector 150a–150n, the U/D counter 162 generally increments an internal count value. If a "0" is presented by a particular PD 150a–150n, the U/D counter 162 generally decrements the internal value. When the counter value increases, the delay circuit 138 may decrease the delay in the reference path REFDLY while increasing the delay in the feedback path FBDLY.

Consider the example where the PLL 140 has converged such that the reference signal REFIN is leading in phase compared to the feedback signal FB. The reference counter 134 and multiplexers 132 may have more time delay than the feedback counter 136. Thus, the reference signal REFIN needs to arrive earlier than the feedback signal FB. However, the condition may also be due to an imbalance in the analog charge pump currents (e.g., within the PLL 140).

If the delay difference (or skew) is great enough, the phase detector 130 will generate all 1's. If the skew is less than the jitter in the circuit 100, the phase detector circuit 130 will generate 1's and 0's but on average will generate more 1's. As a result, the counter value of the U/D counter 162 will increase over time. As the counter value increases, delay is removed from the reference path REFDLY and added to the feedback path FBDLY. The counter value continues to increase until on average as many 1's come out of the PD circuit 130 as 0's. Thus, the average skew at the input may be minimized to within the accuracy of the phase detector circuit 130.

In this manner, the circuit 100 may remove the static skew and may also remove time varying skew as well. The amount of attenuation of time varying skew is dependent on the frequency of the time variations. The circuit 100 may reduce low frequency phase noise created by the PLL 140.

The circuit 100 may be extended to any integer number of inputs. For higher number of inputs, more comparators may be used (e.g., N inputs may use N(N−1)/2 comparators). However, for a basic implementation, the circuit 100 may implement two inputs. Alternatively, additional multiplexers may be implemented to select relevant inputs. However, multiplexers should be minimized since they may introduce additional skew.

The phase comparator circuit 130, the skew delay circuit 138 and the U/D counter 162 may have many potential implementations. The phase comparator circuit 130 may be implemented as a single (or number of) "D" type flip-flops. Ideally the phase comparator circuit 130 may have zero set-up time, since any setup time requirement generates skew at the input. Design considerations may be needed for the circuit 100 if the reference and feedback paths are not running at the same frequency. Different frequencies may be typical in frequency multiplication applications where the feedback is N times the reference frequency. A phase comparison may only be meaningful if made at a transition of the slower running signal. If the phase comparator circuit 130 behaves like a "D" flip-flop, the clock input is generally from the slower running signal such that the output of the flip-flops only changes on the slower signal.

If the application is such that either the reference path or the feedback path may be the higher frequency under different configurations, two-phase comparators for each pair of inputs may be necessary. Such a condition may occur when the system clock is the reference signal and another clock is the feedback signal. A multiplexer may be implemented to select the appropriate comparator output to use. Additionally, comparator designs that accomplish such a task with a single comparator integrated circuit with two output paths may be implemented.

The U/D counter 162 may have a number of special features. One such special feature may be the concept of "pre-scaling". Pre-scaling may force the counter 162 to count multiple times before changing the digital output. The pre-scaling may be equivalent to dividing the digital output word SKEW[N:1] by a constant before proceeding to the skew delay circuit 138. It may also be desirable to prevent the counter 162 from over-flowing or "wrapping" if the count hits full scale. For example, the counter 162 may be implemented that senses an alternating "1" or "0", ignoring the alternating since the net effect on the final count is zero.

The counter 162 may be implemented to update the output whenever the sum changes. Other implementations may only update the final skew output at a certain, fixed times. Various other filtering or counting techniques may be applied to the counter 162. The counter 162 may be a digital filter that integrates the phase detector outputs. Other filters (e.g., linear, non-linear or higher order) may be developed and applied that may have subtle effects on the way the corrections get updated. The discrete switching of skew delay block 138 may add noise to the loop. The spectrum of the noise may be controlled to some extent by performing filtering with the counter 162. Appropriate implementations of the U/D counter 162 may drive the average skew to zero.

Digital signals may also be added to the counter 102 to add desired skew or dynamic phase changes to the output signal FOUT. For example, the output signal FOUT may be phase modulated by adding a time varying digital phase offset to the counter output SKEW[N:1].

The circuit 100 may be implemented with basic self test capability. The design of the circuit 100 may be varied to provide ability to read or set the counter values from an external source. The configurable counter values may allow the circuit 100 to implement self-test features. For example, the skew delay 138 performance may be measured by adjusting the counter values and observing the change in skew. Test modes may also be implemented to by-pass the PLL 140 and measure time delay changes through the circuit 100. By reading the counter values after the loop has converged, a basic measurement of skew for the internal parts (e.g., the multiplexers 132, counters 134, 136 and PLL 140) may be obtained. If the skew on the internal parts is larger than expected the circuit 100 may be discarded as marginal. By allowing the circuit 100 to "converge" and then read the contents of the counter 102, the built in skew of the part that is being corrected may be determined.

The programmable skew delay block 138 may be implemented in a number of ways. In one implementation, the reference path delay REFDLY may decrease while the feedback path delay FBDLY may increase. One path may have a fixed delay, while the other delay path changes (or a combination of both of the delay paths). The reference delay REFDLY may change for one part of the range, while the feedback delay path changes. In general, the skew delay circuit 138 may be implemented such that the changes in delay are small enough not to cause appreciable additional jitter at the output of the PLL 140.

The circuit 100 may (i) correct digital timing skew, (ii) provide a PLL with the addition a digital skew correction circuit, (iii) be capable of self testing skew of a PLL circuit, (iv) correct the skew of multiple digital inputs to a PLL, (v) correct the skew of a PLL completely external to the PLL, and/or (vi) reduce the low frequency phase noise of a PLL (e.g., the circuit 100 may prove matching within 50 pS (<100 pS)).

The circuit 100 may achieve low skew and low frequency phase noise. Low skew and frequency phase noise may be provided by the comparator circuit 130, the counter 162 and the delay block 138. The phase detector 130 may be simple and precise. The phase comparator block 130 may become the reference for low frequency and DC skew errors in the system 100, as opposed to the noisier and less accurate phase detector in the analog PLL 140 and associated digital circuitry before the PLL 140. A digital, or binary output, phase comparator may be more accurate than the phase detector/analog charge pump in a PLL. The circuit 100 may remove path delay differences in digital logic before the PLL 140. The circuit 100 may provide a digitally based skew and low frequency phase noise reduction circuit. The circuit 100 may be applied externally to an existing PLL and does not require changes to the existing PLL. However, the circuit 100 may be implemented along with a PLL on a single integrated circuit. The circuit 100 may be setup with multiple phase comparators to monitor different combinations of inputs. The circuit 100 may allow a simple self test of the internal skew of the PLL path.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to (i) select one of a plurality of input signals and (ii) generate (a) an output signal having a frequency in response to a skew signal and (b) one or more control signals, wherein said first circuit comprises a plurality of phase comparators configured to generate said one or more control signals; and
   a second circuit configured to generate said skew signal in response to said one or more control signals, wherein said first circuit is configured to minimize skew between said selected input signal and said output signal in response to said skew signal.

2. The apparatus according to claim 1, wherein said first circuit further comprises:
   a digitally programmable delay circuit configured to control a delay between said selected input signal and said output signal.

3. The apparatus according to claim 2, wherein said digitally programmable delay circuit is configured to independently control the delay between said selected input signal and said output signal.

4. The apparatus according to claim 1, wherein said second circuit comprises:
   a counter circuit configured to generate said skew signal in response to said one or more control signals, wherein said skew signal comprises a digital word.

5. The apparatus according to claim 1, wherein said first circuit further comprises a phase locked loop (PLL) configured to generate said output signal.

6. The apparatus according to claim 1, wherein said selected input signal comprises a reference clock signal.

7. The apparatus according to claim 1, wherein said apparatus comprises a digitally based skew and low frequency phase noise reduction circuit.

8. The apparatus according to claim 1, wherein said apparatus is implemented externally to an existing PLL.

9. The apparatus according to claim 1, wherein said apparatus is configured to provide a self test of an internal skew.

10. The apparatus according to claim 1, wherein said first circuit comprises:
- a phase comparator circuit comprising and plurality of phase comparators configured to receive said plurality of input signals and generate said one or more control signals;
- a multiplexer circuit configured to receive said plurality of input signals and generate a first clock signal and a second clock signal; and
- a delay circuit configured to delay said first and second clock signals in response to said skew signal.

11. The apparatus according to claim 1, wherein said second circuit comprises:
- a multiplexer circuit configured to receive said one or more control signals; and
- a counter circuit configured to receive an output of said multiplexer and generate said skew signal.

12. An apparatus comprising:
- means (i) for generating (a) an output signal having a frequency in response to a skew signal and (b) one or more control signals and (ii) selecting one of a plurality of input signals;
- means for generating said skew signal in response to said one or more control signals; and
- means for minimizing timing skew between said selected input signal and said output signal, wherein said apparatus is configured to provide a self test of an internal skew and said means for generating the one or more control signals comprises a plurality of phase comparators.

13. A method for correcting skew between an input signal and a feedback of an output signal, comprising the steps of:
(A) receiving a plurality of input signals;
(B) selecting one of said plurality of input signals;
(C) generating one or more control signals;
(D) selecting one of said one or more control signals;
(E) counting the selected control signal;
(F) generating a skew signal in response to a result of step (E); and
(G) adjusting a delay between said selected input signal and said output signal in response to said skew signals by digitally programming said delay.

14. The method according to claim 13, wherein said skew signal comprises a digital word.

15. An apparatus comprising:
- a first circuit configured to (i) select one of a plurality of input signals and (ii) generate (a) an output signal having a frequency in response to a skew signal and (b) one or more control signals with a plurality of phase comparators; and
- a second circuit configured to generate said skew signal in response to said one or more control signals, wherein said first circuit is configured to minimize skew between said selected input signal and a feedback of said output signal in response to said skew signal.

16. An apparatus comprising:
- a first circuit configured to (i) select one of a plurality of input signals and (ii) generate (a) an output signal having a frequency in response to a skew signal and (b) one or more control signals, wherein said first circuit comprises a digitally programmable delay circuit configured to control a delay between said selected input signal and said output signal; and
- a second circuit configured to generate said skew signal in response to said one or more control signals, wherein (i) said first circuit is configured to minimize skew between said selected input signal and said output signal in response to said skew signal using the delay and (ii) said second circuit comprises a multiplexer circuit configured to receive said one or more control signals and a counter circuit configured to receive an output of said multiplexer to generate said skew signal.

17. An apparatus comprising:
- a first circuit configured to (i) select one of a plurality of input signals and (ii) generate (a) an output signal having a frequency in response to a skew signal and (b) one or more control signals; and
- a second circuit comprising a multiplexer circuit configured to receive said one or more control signals and a counter circuit configured to receive an output of said multiplexer and generate said skew signal in response to said one or more control signals, wherein (i) said first circuit is configured to minimize skew between said selected input signal and said output signal in response to said skew signal, and (ii) said skew signal comprises a digital word.

* * * * *